United States Patent [19]

Weber

[11] Patent Number: 4,727,583

[45] Date of Patent: Feb. 23, 1988

[54] TELEPHONE TRANSDUCER WITH IMPROVED FREQUENCY RESPONSE

[75] Inventor: Paul J. Weber, Elgin, Ill.

[73] Assignee: Motorola, Inc., Schaumburg, Ill.

[21] Appl. No.: 924,527

[22] Filed: Oct. 28, 1986

[51] Int. Cl.[4] .............................................. H03G 5/00

[52] U.S. Cl. ........................................ 381/90; 381/98; 381/117; 381/159; 181/160

[58] Field of Search ................. 381/102, 117, 159, 98, 381/90; 181/160, 182, 158; 379/395

[56] References Cited

U.S. PATENT DOCUMENTS

| | | | |
|---|---|---|---|
| 2,423,014 | 6/1947 | Gilman | 381/90 |
| 2,745,508 | 5/1956 | Vadersen | 181/158 |
| 3,033,945 | 5/1962 | Villchur | 381/159 |
| 3,246,721 | 4/1966 | Martin | 181/160 |
| 4,403,120 | 9/1983 | Yoshimi | 381/159 |
| 4,449,019 | 5/1984 | Kakehi | 381/159 |
| 4,481,662 | 11/1984 | Long et al. | 381/98 |
| 4,594,478 | 6/1986 | Gumb | 381/159 |
| 4,646,873 | 3/1987 | Bryson | 181/160 |

FOREIGN PATENT DOCUMENTS

| | | | |
|---|---|---|---|
| 1144295 | 3/1969 | Austria . | |
| 1301014 | 12/1972 | Austria . | |
| 1379372 | 1/1975 | Canada . | |
| 0040948 | 2/1981 | European Pat. Off. . | |
| 161735 | 11/1985 | European Pat. Off. | 381/159 |
| 1082433 | 9/1967 | Fed. Rep. of Germany . | |
| 6021694 | 2/1985 | Japan | 381/159 |
| WO81/03099 | 10/1981 | PCT Int'l Appl. . | |

*Primary Examiner*—Gene Z. Rubinson
*Assistant Examiner*—L. C. Schroeder
*Attorney, Agent, or Firm*—Donald B. Southard; Anthony J. Sarli, Jr.; Margaret M. Parker

[57] ABSTRACT

An audio arrangement includes a thin speaker/transducer positioned within a portable housing wherein the speaker cavity is dimensioned to move the resonant frequency of the speaker/housing combination up to approximately the free-air cutoff frequency of the speaker/tranducer. The resulting response then falls off at about 6 db/octave below that point. An amplifier having gain increasing at 6 db/octave is placed in the signal input path for creating an essentially flat frequency response in the normally desired audio range.

11 Claims, 9 Drawing Figures

FIG. 1
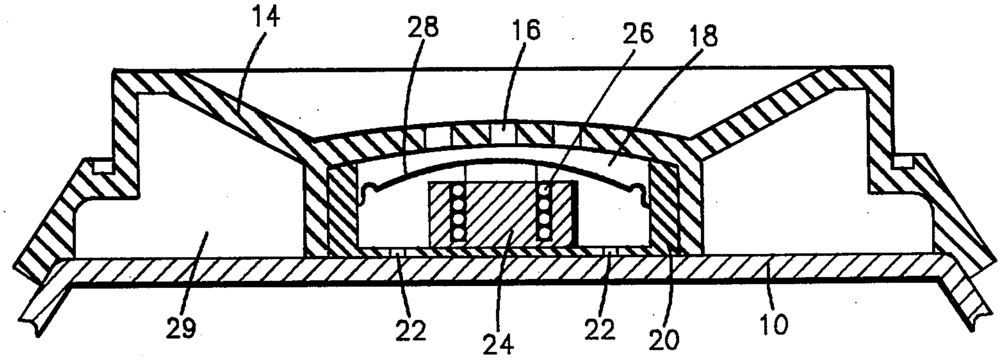
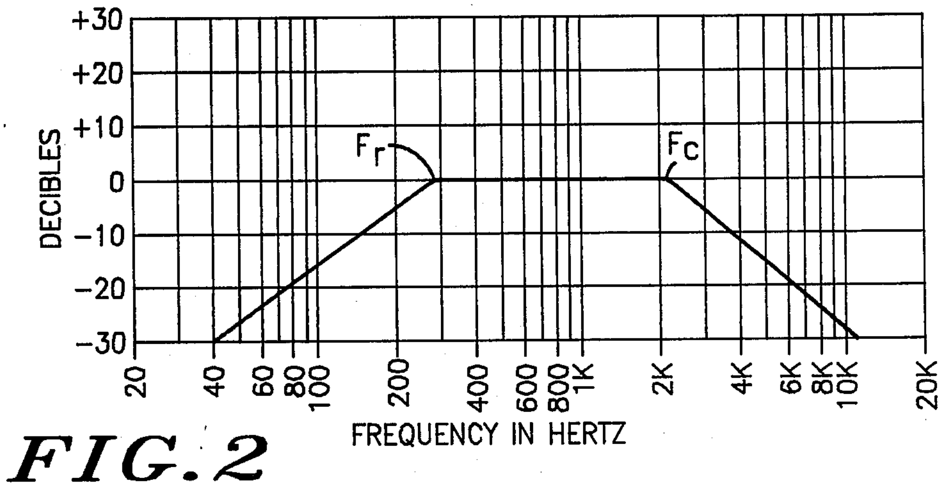
FIG. 2
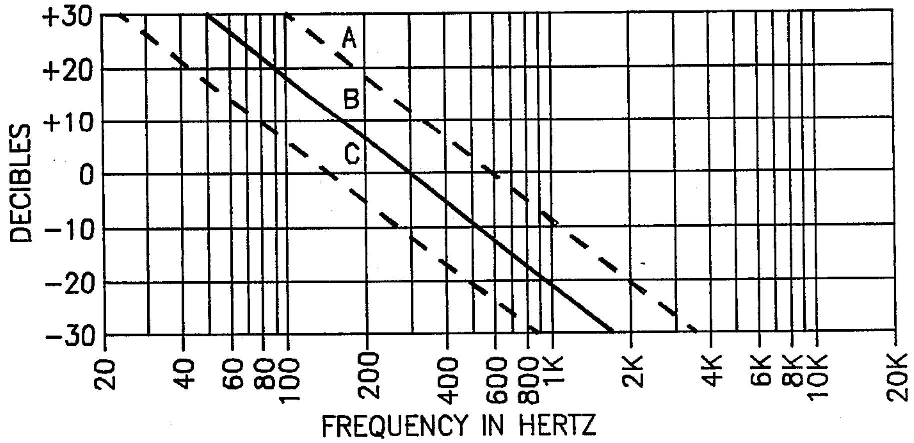
FIG. 3

TELEPHONE TRANSDUCER WITH IMPROVED FREQUENCY RESPONSE

BACKGROUND OF THE INVENTION

This invention relates to sound reproduction and, more particularly, to small transducers retained in small housings but having satisfactory frequency response.

The problem of obtaining the best possible frequency response from less than ideal components and structures is as old as the art of sound reproduction. The goal in any system, of course, is to reproduce all of the range of frequencies available in the signal without distortion. In the most expensive audio systems, large cabinets can be used with multiple speakers, elaborately designed baffles, etc., but when there are limitations of size, weight and cost, compromises must be made and sound quality deteriorates. Early in the development, it was found that sound waves passing from the front of a speaker around to the back of the speaker reduced sound quality. A speaker placed in the middle of a wall or a baffle of infinite dimensions was theoretically desirable but not practical. The best practical approach to an infinite baffle was a box or cabinet which is closed or nearly closed in the back. In a typical arrangement, the resonance of an 8" speaker in a closed box would likely be in the range of 60–200 Hz, with output decreasing at 12 db/octave below resonance. Resonance would be in the order of 30–60 Hz for 12–15" speakers. Techniques have been developed which can extend the normal response another octave down, with subsequent falloff at perhaps 24–30 db/octave. It has not been considered a desirable solution to move the resonant frequency higher than the desired frequency range.

In a U.S. Pat. No. 4,481,662, processing of the signals being input to a speaker was used to flatten out the frequencies below the system resonance, with the result that frequencies above normal resonance were attenuated by 12, 18 or 24 db/octave. Frequencies above cutoff were attenuated by another 12 db/octave.

In telephones and telephone-type devices, the speaker is small with close coupling to the ear of the user, and can provide a reasonably flat response from 250 to 3000 Hz. In the case of portable phones and radios, however, the speaker and speaker enclosure are likely to be much smaller and thinner, and telephone sound quality is very difficult to obtain.

SUMMARY OF THE INVENTION

It is an object of this invention, therefore, to obtain maximum sound quality from a transducer which is thin and is positioned in a very thin enclosure.

This and other objects which will become apparent are obtained in a combination where the volume of the enclosure behind the speaker is small enough to raise the resonant frequency out of the usable sound range. This produces a falloff of 6 db/octave below resonance. The overall output response is then flattened out with appropriate pre-emphasis.

BRIEF DESCRIPTION OF THE DRAWINGS

FIG. 1 is a cutaway view of a transducer arrangement such as could be used in the invention.

FIGS. 2–4 are frequency response curves of the prior art relating to a similar transducer arrangement.

DETAILED DESCRIPTION OF THE INVENTION

Figure 4:
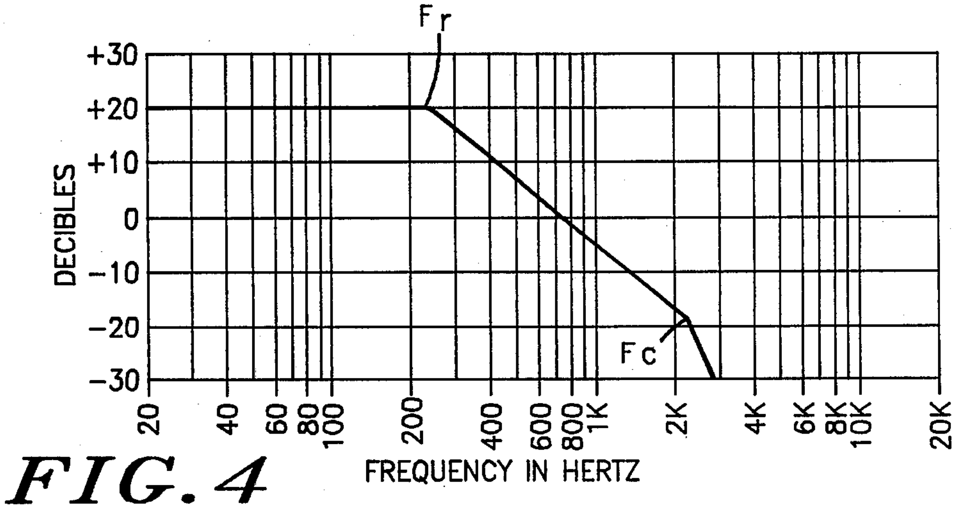

FIG. 1 shows a preferred arrangement with a transducer such as the type used in small portable radios or mobile phones. In this cutaway view an apparatus housing 10 is partially shown. The housing 10 may be of metal or other suitable material for protecting the electronic components. One housing wall provides a rigid support surface for a speaker retainer 14 or "ear cup", which is typically of plastic. The top surface of the retainer 14 may be contoured to accommodate the ear of the user. Small sound apertures 16 lead through the center surface of the retainer 14 to an interior cavity 18 which contains a speaker enclosure 20. The speaker enclosure 20 is tightly retained within the cavity 18 with essentially zero clearance behind the structure. Typical dimensions for the enclosure 20 might be 0.75 in. wide and 0.125 in thick. The back wall of the speaker structure 20 contains a number of sound apertures 22 which were designed to be open to the atmosphere or at least to a much larger cavity. In the present invention, the apertures 22 are essentially blocked by the wall of the housing 10. Mounted in the center of the back wall of the enclosure 20 is a permanent magnet structure 24. A speaker coil (or voice coil) 26 is mounted on a speaker diaphragm or cone 28 to cooperate with the magnet structure 24 for driving the speaker cone as is customary. Since the electrical connections to the speaker coil form no part of this invention, none are shown here.

The preferred type of cone is essentially "inverted", with the cone flaring away from the sound apertures 16 rather than toward them as is customary. The edge of the cone 28 is supported near the middle of the wall of the enclosure 20 with the center of the cone slightly higher than the wall. The "front" of the cone 28 is spaced away from the inner surface of the speaker retainer 14 just enough to allow freedom of motion for the cone. In back of the cone 28 is a very small volume of trapped air 29. As is well known, the air within a speaker enclosure constitutes a load upon the speaker, with a closed cabinet providing a higher resonant frequency than an open cabinet, all dimensions remaining the same. A reduction in the size of the cabinet raises the resonant frequency of a system. If both the speaker size and the cabinet size are reduced, the resonance of the combination increases even faster, with the usual limitation being that the resonance be kept within the desired frequency range. In the present invention, that limitation has been removed. The speaker cone 28 is quite shallow, and the volume of the air load 29 (with the apertures 22 blocked) is small enough to raise the resonant frequency of the system to near or even above the free-air cutoff point.

FIGS. 2–4 are the frequency response curves of a somewhat larger prior art device which attempted to solve a problem similar to that of the present invention. These curves are adapted from the above-referenced U.S. Pat. No. 4,481,662, filed Jan. 7, 1982. FIG. 2 is a somewhat idealized curve with the speaker/driver in a closed box. $F_r$ represents the resonant frequency of the combined unit throughout these illustrations. $F_c$ indicates the "cutoff" frequency in each instance. In this prior art example, the resonant frequency is seen to be in the neighborhood of 270 Hz, with a cutoff frequency of about 2 kHz and a flat response between those two points.

FIG. 3 shows the response curves of a doubly integrating amplifier which can be used with the prior art invention, the three curves illustrating three levels of gain in the circuit and each having approximately a 12 db falloff per octave.

FIG. 4 shows the audio output curve of the driver/box combination of FIG. 2 with the de-emphasis of FIG. 3 added. The resulting response is seen to be flat up to about 240 Hz, then falling at about the 12 db rate to the cutoff frequency $F_c$. Beyond the cutoff point, the response falls at a rate approaching 24 db per octave. It is apparent that, while the very low frequency response has been improved, this is not the usual response curve desired for an audio device. It is not stated how this unusual curve is utilized.

Figure 5:
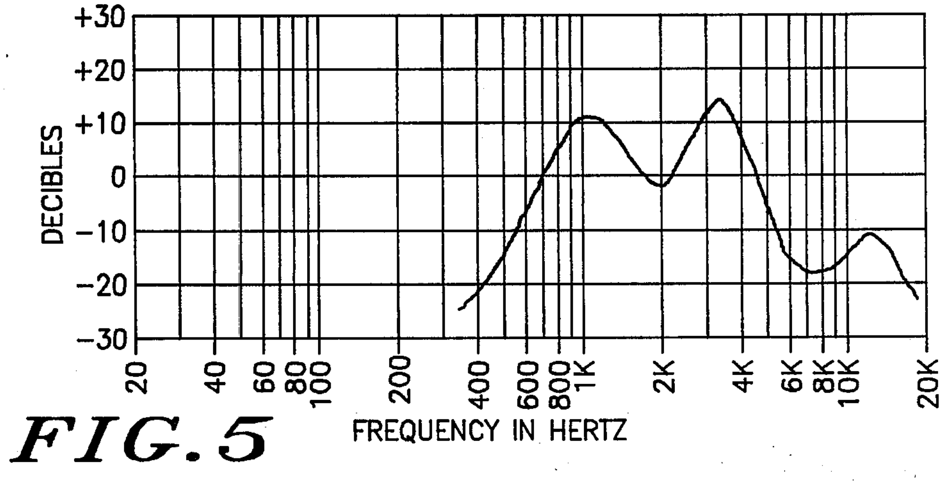
FIGS. 5–8 are frequency response curves relating to the arrangement of FIG. 1.

FIGS. 5–8 illustrate responses of the present invention as contrasted with the prior art of FIGS. 2–4. FIG. 5 is the free-air suspension response curve for a small transducer such as might be used in a portable phone or radio, having its resonance and cutoff peaks at 1.0 and 3.4 kHz, respectively. One typical application for such a transducer is in the type of radio having one "speaker", partially surrounded by a cushion of foam, held against each ear by a band over the top of the user's head.

Figure 6:
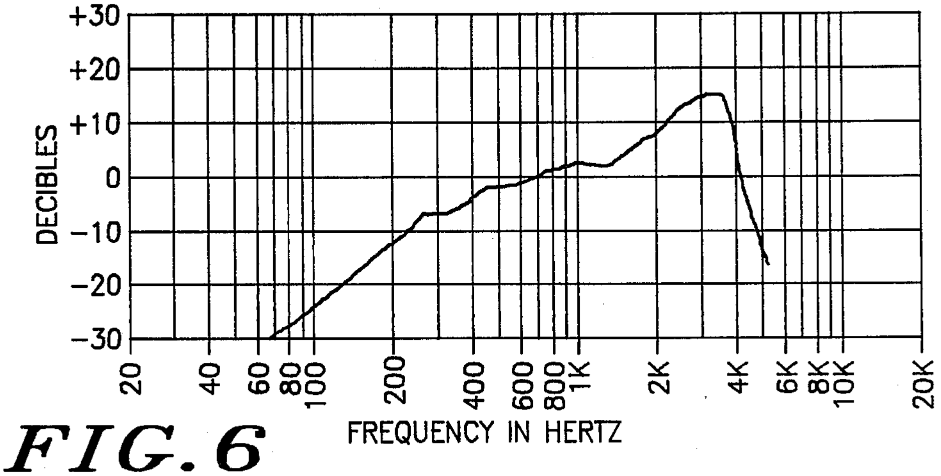
Figure 7:
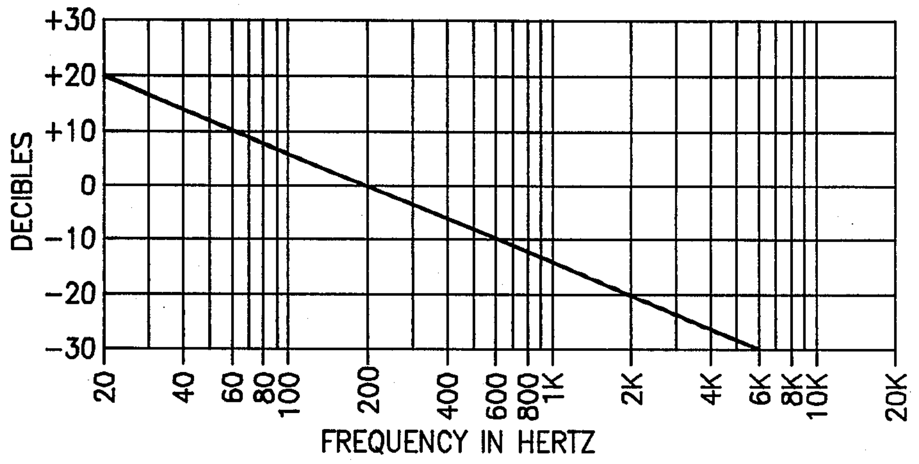

FIG. 6 corresponds to FIG. 2 of the prior art, and shows the response of the transducer of FIG. 5 in the very small enclosure of the present invention (as seen in FIG. 1). The resonant frequency has been raised to almost the cutoff frequency or above creating one peak at about 3 kHz. The response below that point falls off at essentially 6 db/octave. FIG. 7 shows the response curve of a amplifier having 6 db/octave of pre-emphasis at the low frequencies.

Figure 8:
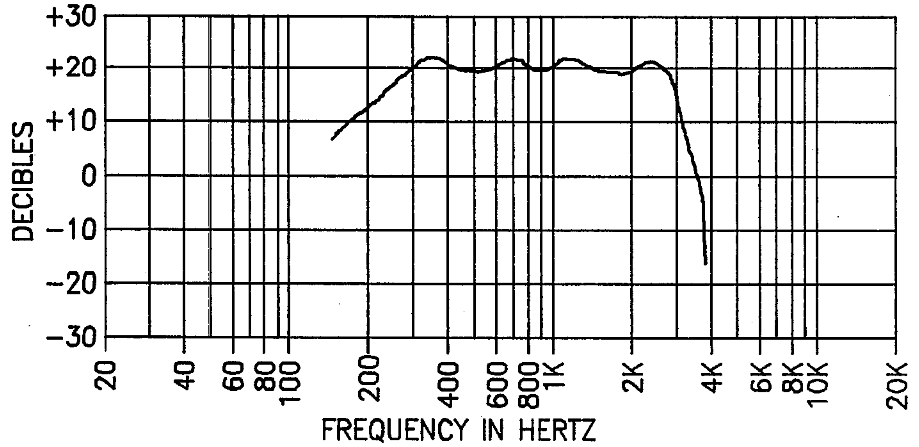

FIG. 8 combines the curves of FIGS. 6 and 7 according to the invention, showing a relatively flat response in the desired frequency range between about 300 Hz and 2700 Hz, with a steep cutoff above 2700 Hz and about 6 or 7 db/octave below 300 Hz.

Figure 9:
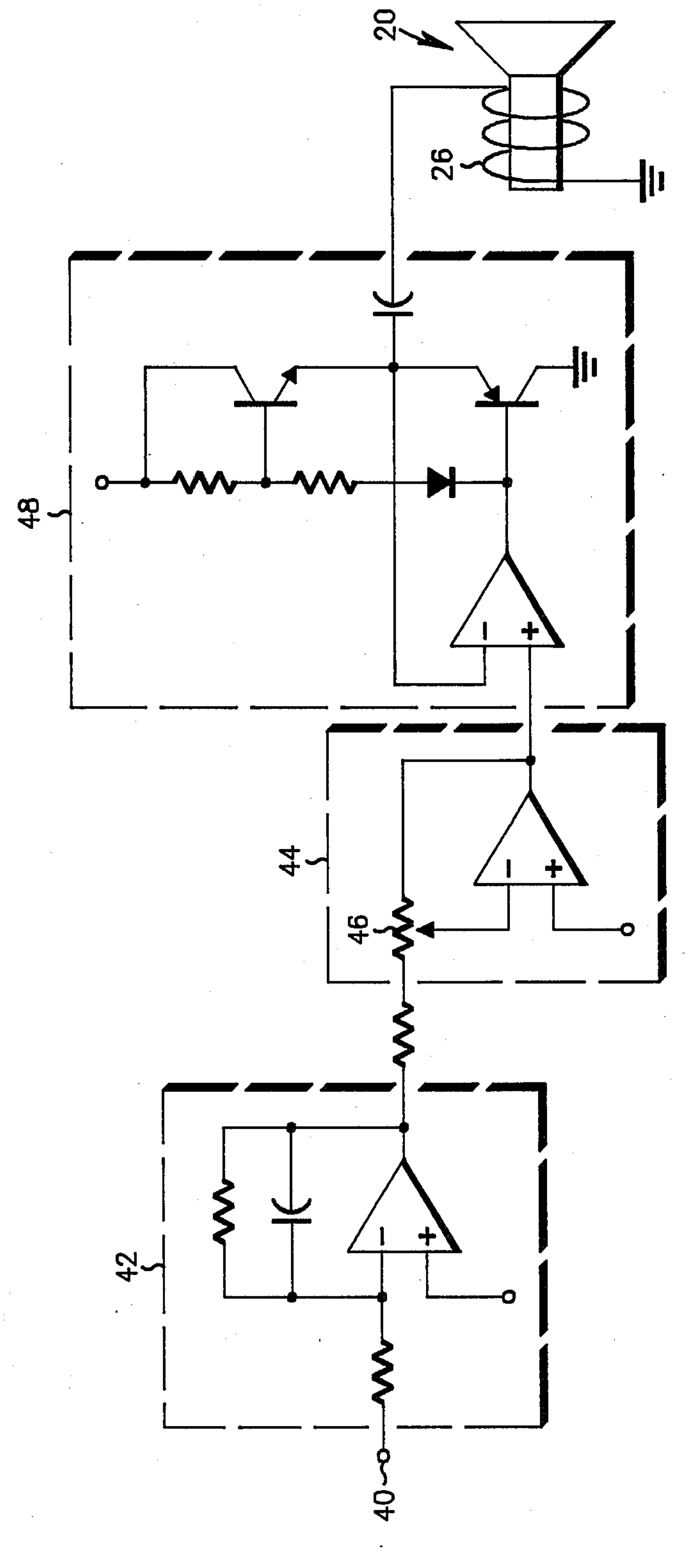
FIG. 9 is a diagram of an audio apparatus employing the invention.

FIG. 9 is a block diagram of a typical audio apparatus employing the present invention. At an input terminal 40 an audio frequency signal is received and coupled to an input of an amplifier stage 42 having the characteristics as charted in FIG. 7. This stage will preferably be a single integrating stage. Following may be a variable gain stage 44 with a user-controllable attenuator 46. Coupled to the output of the variable gain stage 44 is a speaker driver stage 48 which is coupled to drive the coil 26 of the speaker 20. In this arrangement, the pre-emphasis is accomplished at the lowest possible power level, as is desirable.

Thus, there has been shown and described an arrangement of speaker/transducer and housing with complementary pre-emphasis which provides a fairly flat response in the desired frequency range in spite of the unusual thinness of the speaker and the housing. Other variations and embodiments of the invention are possible, and it is intended to cover all which fall within the scope of the appended claims.

What is claimed is:

1. An audio arrangement comprising:

an audio transducer having an enclosure, a speaker cone supported by said enclosure, a magnet, a coil for driving said cone, and sound apertures;

housing means having a cavity therein for containing said transducer enclosure and including means for closing said sound apertures, the housing means being dimensioned for moving the resonant frequency of the contained transducer to essentially the free-air cutoff frequency of the transducer;

amplifier means coupled to said driving coil for providing an essentially flat audio frequency response within the normally desired audio frequency range.

2. An audio arrangement in accordance with claim 1 and further including additional audio gain stages coupled between said amplifier means and said driving coil.

3. An audio arrangement in accordance with claim 2 and wherein one of said additional stages is a variable gain stage.

4. An audio arrangement in accordance with claim 1 and wherein the frequency response of said amplifier means decreases at approximately 6 db/octave with increasing frequency in at least the desired audio frequency range.

5. An audio arrangement in accordance with claim 1 and wherein the flat audio frequency output includes those frequencies above about 250 Hz and below about 3500 Hz.

6. An audio arrangement comprising:

an audio transducer having a natural resonance within a desired audio frequency range and a cutoff frequency, and including a speaker cone and a coil for driving said cone;

a housing having a cavity therein for containing said transducer, said cavity raising said resonant frequency to essentially the cutoff frequency; and amplifier means coupled to said driving coil for providing a flat audio output response from said arrangement within at least the desired audio frequency range.

7. An audio arrangement in accordance with claim 6 and wherein the frequency response of said amplifier means decreases at approximately 6 db/octave with increasing frequency in at least the desired audio frequency range.

8. An audio arrangement in accordance with claim 6 and further including additional audio gain stages coupled between said amplifier means and said driving coil.

9. An audio arrangement in accordance with claim 8 and wherein one of said additional stages is a variable gain stage.

10. An audio arrangement in accordance with claim 6 and wherein the flat audio frequency output includes those frequencies above about 250 Hz and below about 3500 Hz.

11. A method for improving the frequency response in a miniaturized audio apparatus and consisting of the following steps;

providing a transducer having a free-air resonance within the desired audio frequency range and a cutoff frequency at or above the upper end of said desired range;

positioning said transducer in an enclosure dimensioned for raising the resonant frequency of the transducer/enclosure combination to near or above said cutoff frequency, and creating a frequency response below said raised resonance frequency which decreases at a rate of about 6 db/octave with decreasing frequency; and coupling audio frequency signals to said transducer through an amplifier stage having a frequency response below said raised resonance frequency which increases at a rate of about 6 db/octave with decreasing frequency, thus providing an audio frequency output which is relatively flat within said desired frequency range.

* * * * *